United States Patent
Chen

(10) Patent No.: US 8,531,249 B2
(45) Date of Patent: Sep. 10, 2013

(54) OSCILLATOR FOR GENERATING OUTPUT SIGNAL WITH ADJUSTABLE FREQUENCY

(75) Inventor: Yi-Lung Chen, Keelung (TW)

(73) Assignee: ISSC Technologies Corp., Hsinchu (TW)

( * ) Notice: Subject to any disclaimer, the term of this patent is extended or adjusted under 35 U.S.C. 154(b) by 0 days.

(21) Appl. No.: 13/327,766

(22) Filed: Dec. 16, 2011

(65) Prior Publication Data
US 2013/0154749 A1 Jun. 20, 2013

(51) Int. Cl.
*H03K 3/03* (2006.01)
*H03B 5/20* (2006.01)

(52) U.S. Cl.
USPC ........ 331/143; 331/135; 331/177 R; 331/179; 331/111; 331/108 B

(58) Field of Classification Search
USPC ............... 331/143, 144, 152, 113 R, 57, 111, 331/135, 108 B, 179, 177 R, 36
See application file for complete search history.

(56) References Cited

U.S. PATENT DOCUMENTS

| | | | |
|---|---|---|---|
| 5,180,991 A * | 1/1993 | Takashima | 331/1 A |
| 5,767,747 A | 6/1998 | Pricer | |
| 6,005,449 A | 12/1999 | Oberlin | |
| 6,462,625 B2 | 10/2002 | Kim | |
| 7,129,798 B2 * | 10/2006 | Aoyama et al. | 331/135 |
| 7,271,670 B2 * | 9/2007 | Nishi et al. | 331/143 |
| 7,529,317 B2 | 5/2009 | Chien et al. | |
| 7,646,257 B2 * | 1/2010 | Gailus et al. | 331/177 V |
| 7,889,016 B2 * | 2/2011 | Wang | 331/111 |
| 8,207,795 B2 * | 6/2012 | Wang | 331/57 |

* cited by examiner

*Primary Examiner* — Ryan Johnson
(74) *Attorney, Agent, or Firm* — Jianq Chyun IP Office

(57) ABSTRACT

An oscillator is provided and includes a resistance unit, a capacitance unit, a first inverter and a second inverter. The resistance unit is serially connected between a first reference point and a second reference point. The capacitance unit is coupled between the first reference point and an output point, and includes capacitors. One terminal of each of the capacitors is coupled to the output point, and the other terminal of each of the capacitors is coupled to the first reference point or a reference ground according to a control signal. The input terminal of the first inverter is coupled to the first reference point, and the output terminal of the first inverter is coupled to the second reference point. The input terminal of the second inverter is coupled to the output terminal of the first inverter, and the output terminal of the second inverter is coupled to the output point.

7 Claims, 3 Drawing Sheets

OSCILLATOR FOR GENERATING OUTPUT SIGNAL WITH ADJUSTABLE FREQUENCY

BACKGROUND OF THE INVENTION

1. Field of the Invention

The invention generally relates to an oscillator, in particular, to a RC oscillator.

2. Description of Related Art

Generally speaking, an oscillator may be applied to various electronic products for providing a required clock signal in the inner circuit of the electronic products.

In the electronic products nowadays, such as communication devices or mobile devices, for fitting the requirement of small volume, the oscillator is usually implemented in an integrated circuit to save the layout space of the devices. Wherein, the oscillator in the integrated circuit usually includes resistors and capacitors, and the periodic clock signal is generated by delay time through charging and discharging the resistors and the capacitors of the integrated circuit. However, the resistances in the integrated circuit easily alter following the change of temperature. Moreover, in a prior art, the oscillating frequency of the output signal of the RC oscillator is dependent on an operation voltage received by the RC oscillator. Therefore, in the condition that the operation voltage alters, the frequency of the output signal generated by the RC oscillator changes correspondingly and further the stability of a system having the RC oscillator is affected.

SUMMARY OF THE INVENTION

Accordingly, the present invention is directed to an oscillator, and further to increase the stability of the frequency of the output signal generated by the oscillator.

The present invention is directed to an oscillator and the oscillator includes a resistance unit, a capacitance unit, a first inverter, and a second inverter. Wherein, the resistance unit is serially connected between a first reference point and a second reference point. The capacitance unit is coupled between the first reference point and an output point, and the capacitance unit includes a plurality of capacitors. One terminal of each of the capacitors is coupled to the output point, and the other terminal of each of the capacitors is coupled to the first reference point or a reference ground according to a control signal. The first inverter has an input terminal which is coupled to the first reference point and the first inverter has an output terminal which is coupled to the second reference point. The second inverter has an input terminal which is coupled to the output of the first inverter, and the second inverter has an output terminal which is coupled to the output point.

Based on the description above, the capacitors of the capacitance unit of the oscillator of the invention switches one end of each of the capacitors between the output point and the reference ground to adjust the equivalent capacitance of the capacitance unit according to the control signal received by the capacitance unit. And, through the adjustment of the capacitance unit, the dependency between the oscillating frequency of the output signal generated by the oscillator and the operation voltage received by the oscillator is decreased, and the output signal having a stable oscillating frequency is offered.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
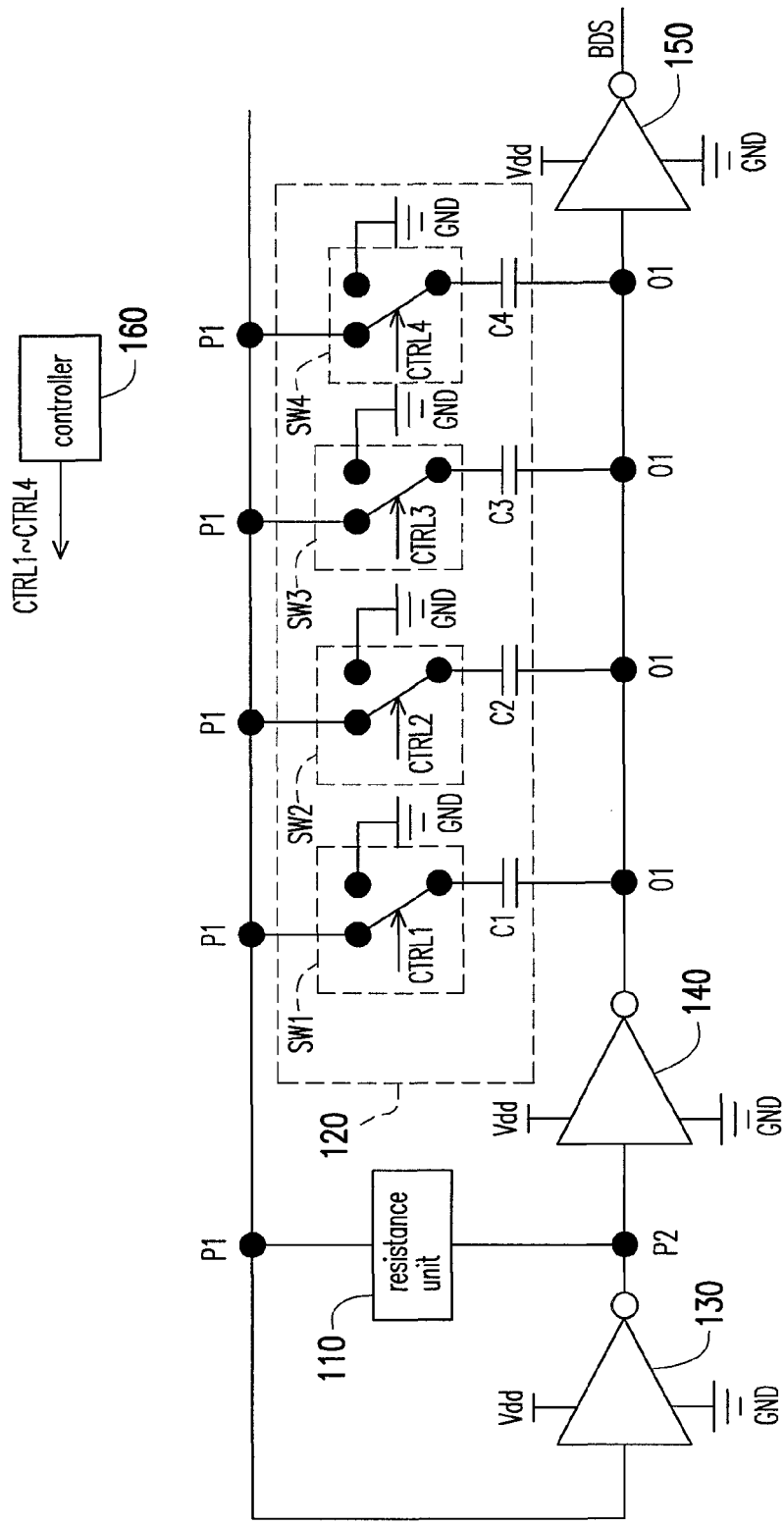
FIG. 1 shows a schematic view of an oscillator 100 according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 shows a schematic view of an oscillator 100 according to an embodiment of the invention. Please refer to FIG. 1. The oscillator 100 includes a resistance unit 110, a capacitance unit 120, an inverter 130, and an inverter 140. Wherein, the resistance unit 110 is serially connected between a reference point P1 and a reference point P2. The capacitance unit 120 is coupled between the reference point P1 and an output point O1, and the capacitance 120 has a plurality of capacitors C1-C4. Wherein, one terminal of each of the capacitors C1-C4 switches the connection between the reference point P1 and a reference ground GND according to control signals CTRL1-CTRL4 respectively. An input terminal of the inverter 130 is coupled to the reference point P1, and an output terminal of the inverter 130 is coupled to the reference point P2. An input terminal of the inverter 140 is coupled to the output terminal of the inverter 130, that is, the reference point P2, and an output terminal of the inverter 140 is coupled to an output point O1. In the embodiment, the oscillator 100 further includes an inverter 150 for buffering the output signal of the oscillator, and the inverter 150 outputs a buffered driving signal BDS, and the inverter 150 transmits the buffered driving signal BDS to a circuit of next stage which is connected to the oscillator 100.

Based on the circuit configuration of the oscillator 100 in FIG. 1, the frequency f of the output signal of the oscillator 100 is formed as the following formula 1:

$$f = \frac{1}{2\ln\left[\frac{Vth}{Vth + \frac{Cselect}{Ctotal}Vdd}\right] \cdot R \cdot Cselect} \quad 1$$

Wherein the frequency f is the frequency of the output signal of the oscillator 100; Cselect is the equivalent capacitance between the reference point P1 and the output point O1; Vth is the threshold voltage of the inverters 130 and 140; Ctotal is the sum of the capacitance of the total capacitors of the capacitance unit 120; R is the equivalent resistance between the reference points P1 and P2.

As shown in formula 1, the frequency f of the output signal of the oscillator 100 is dependent on the threshold voltage Vth of the inverters 130 and 140. Wherein, the inverters 130 and 140 are usually respectively formed with an n-type transistor and a p-type transistor. Furthermore, through the semiconductor process parameters of the n-type transistor and the p-type transistor of the inverters 130 and 140, the threshold voltage Vth of the inverters 130 and 140 is inferred as the following formula 2:

$$Vth = \frac{Vthn + \sqrt{\frac{Up \cdot Cox \cdot \frac{Wp}{Lp}}{Un \cdot Cox \cdot \frac{Wn}{Ln}}}(Vdd + Vthp)}{1 + \sqrt{\frac{Up \cdot Cox \cdot \frac{Wp}{Lp}}{Un \cdot Cox \cdot \frac{Wn}{Ln}}}} \quad 2$$

Wherein, Up is the carrier mobility of the channels of the p-type transistors of the inverters 130 and 140; Wp/Lp is the ratio of the width to the length of the channels of the p-type transistors of the inverters 130 and 140; Un is the carrier mobility of the channels of the n-type transistors of the inverters 130 and 140; Wn/Ln is the ratio of the width to the length of the channels of the n-type transistors of the inverters 130 and 140; Cox is the capacitance of the gate oxide layers of the n-type transistor and the p-type transistor; Vthn is the threshold voltage of the n-type transistor and Vthp is the threshold voltage of the p-type transistor.

As shown in formula 2, the ratio of the width to the length of the p-type transistors of the inverters 130 and 140 (Wp/Lp) could be set to the value 5, and the ratio of the width to the length of the n-type transistors of the inverters 130 and 140 (Wn/Ln) could be set to the value 44.4. In other words, the layout area of the n-type transistor is about 8 times as the layout area of the p-type transistor. Through the implementation of the ratios of the widths to the lengths described above, the frequency f of the output signal of the oscillator 100 according to an embodiment of the invention does not vary too much as an operation voltage Vdd of the oscillator 100 drifts.

Figure 2:
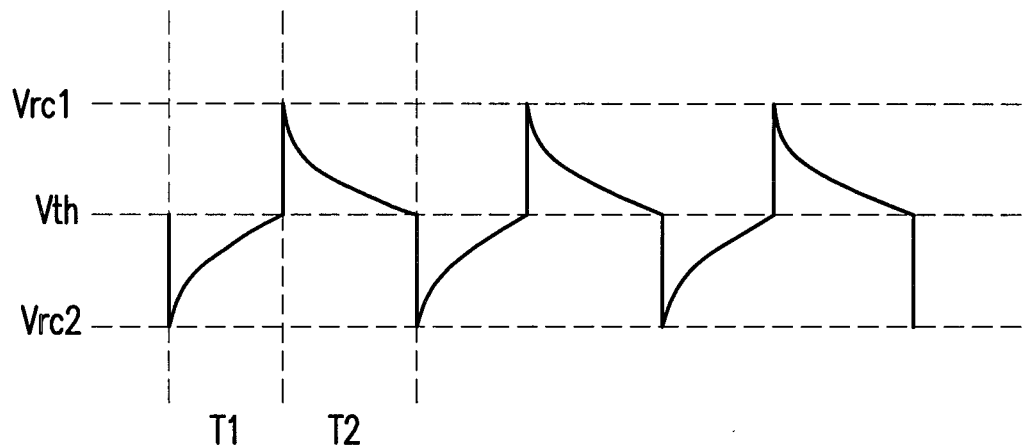
FIG. 2 shows the waveform of the reference point P1 of the oscillator according to an embodiment of the invention.

In the real operation, please refer to FIG. 1 and FIG. 2 for a further explanation. FIG. 2 shows the waveform of the reference point P1 of the oscillator 100 according to an embodiment of the invention. When entering a rising period T1, the inverter 130 outputs a voltage with a high voltage level as the operation voltage Vdd at the reference point P2, and the inverter 140 outputs a voltage with a low voltage level as the reference ground GND at the reference point O1. Meanwhile, the inverter 130 charges the capacitance unit 120 through the resistance unit 110. Thus, during the rising period T1, the voltage variation at the reference point P1 shows a rising charge curve. When the reference point P1 which is coupled to the capacitance unit 120 is charged to the level more than the threshold voltage Vth, the output terminals of the inverter 130 and 140 change state. Then, the inverter 130 outputs a voltage with a low voltage as the reference ground GND at the reference point P2, and the inverter 140 outputs a voltage with a high voltage level as the operation voltage Vdd at the output point O1. In the mean time, the voltage of the reference point P1 is driven to a high voltage level Vrc1 in response to the voltage of the output point O1, and then a falling period T2 is entered.

During the falling period T2, due to the low voltage level as the reference ground GND at the reference point P2, the capacitance unit 120 is discharged through the resistance unit 110. Thus, the voltage variation at the reference point P1 has a falling discharge curve. When the voltage of the reference point P1 is discharged to the value less than the threshold voltage Vth of the inverters 130 and 140, the output terminals of the inverters 130 and 140 change state again, and allow the reference point P2 and the output point O1 respectively have a high voltage level as the threshold voltage Vdd and a low voltage level as the reference ground GND. Besides, the reference point P1 is driven down to a voltage level Vrc2 in response to the voltage of the output voltage O1. Then, the rising period T1 is entered again. By charging and discharging the reference point P1 continuously, the rising period T1 and the falling period T2 take turns consistently, and a periodic signal is further generated at the output point O1.

By changing the equivalent capacitance of the capacitance unit 120, the time to charge or discharge the reference point P1 to the threshold voltage Vth of the inverters 130 and 140 could be changed, and the frequency of the output signal of the oscillator 100 is further changed. The capacitance unit 120 further includes a plurality of switches SW1-SW4 which are respectively coupled between the capacitors C1-C4 and the reference point P1. The switches SW1-SW4 have a first terminal, a second terminal, a third terminal, and a control terminal. Wherein, the first terminals of the switches SW1-SW4 are respectively coupled to one terminal of each of the capacitors C1-C4. The second terminals of the switches SW1-SW4 are all coupled to the reference point P1, and the third terminals of the switches SW1-SW4 are all coupled to the reference ground GND. Besides, the control terminals of the switches SW1-SW4 respectively receive the control signals CTRL1-CTRL4, and the terminals of capacitors C1-C4 (i.e. the terminals connected to the first terminals of the switches SW1-SW4) are coupled to the reference ground point P1 or the reference ground GND respectively according to the control signals CTRL1-CTRL4. For example, if the switch SW1 receives the control signal CTRL1 with a high voltage level, the switch SW1 will allow one terminal of the capacitor C1 to be coupled to the reference point P1. On the contrary, if the switch SW1 receives the control signal CTRL1 with a low voltage level, the switch SW1 will allow one end of the capacitor C1 to be coupled to the reference ground GND.

Herein, the switching state of the switches SW1-SW4 could be set respectively according to the control signals CTRL1-CTRL4. Besides, the number of the capacitors C1-C4 of the embodiment is just an example, and it is not limited to the invention.

Noteworthily, the way to control the switches SW1-SW4 with the control signals CTRL1-CTRL4 may be defined by users. Therefore, the definition could also be shown as the following description. When the control signals CTRL1-CTRL4 are low voltage levels, one terminal of each of the capacitors C1-C4 is coupled to the reference point P1. And, when the control signals CTRL1-CTRL4 are high voltage levels, one terminal of each of the capacitors C1-C4 is coupled to the reference ground GND. However, the relevance between the switching state and the control signals of the switches of the invention is not limited thereto.

Since the switches SW1-SW4 of the capacitance unit 120 switch connections by receiving the control signals CTRL1-CTRL4, the oscillator 100 further includes a controller 160 to respectively generate the control signals CTRL1-CTRL4 to the control terminals of the switches SW1-SW4 according to another embodiment of the invention. In an embodiment of the invention, the controller 160 decides the voltage levels of the control signals CTRL1-CTRL4 respectively received by the switches SW1-SW4 by referring to switch information. For example, when the switch information which the controller 160 refers to is the value 1, the control signal CTRL1 received by the switch SW1 is a high voltage level, and the control signals CTRL2-CTRL4 respectively received by the switches SW2-SW4 are low voltage levels. Then, the capacitor C1 is coupled to e.g. the reference point P1, and the capacitors C2-C4 are coupled to e.g. the reference ground GND accordingly. As another example, when the switch information is the value 3, the control signals CTRL1-CTRL2 respectively received by the switches SW1 and SW2 are high voltage levels and the control signals CTRL3-CTRL4 respectively received by the switches SW3 to SW4 are low voltage levels. In addition, in the embodiment, the ratio between the capacitances of the capacitors C1-C4 could be set as a geometric series. For example, the capacitance of the capacitor C3 is twice as the capacitance of the capacitor C2, and the capacitance of the capacitor C2 is also twice as the capacitance of the capacitor C1.

Wherein, the switch information described above could be determined by the oscillating frequency of the output signal of the oscillator 100.

Figure 3:
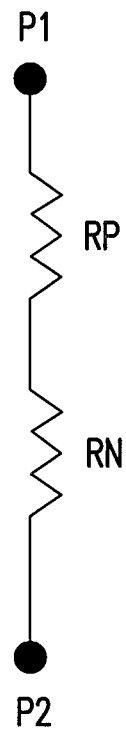
FIG. 3 shows a schematic view of the resistance unit according to an embodiment of the invention.

FIG. 3 shows a schematic view of the resistance unit 110 according to an embodiment of the invention. Please refer to FIG. 1 and FIG. 3. To overcome the problem that the resistance in an integrated circuit easily varies as temperature changes and the frequency of the output signal of the oscillator 100 is further unstable, the resistance unit 100 includes a positive temperature coefficient resistor RP and a negative temperature coefficient resistor RN. Wherein, the positive temperature coefficient resistor RP is formed with poly silicon, and the negative temperature coefficient resistor RN is formed with N-well area. In an embodiment of the invention, by respectively setting the positive temperature coefficient resistor RP and the negative temperature coefficient resistor RN, the possibility that the frequency of the output signal of the oscillator is affected by the resistance deviation of the oscillator of the prior art caused by room temperature will be decreased.

Figure 4:
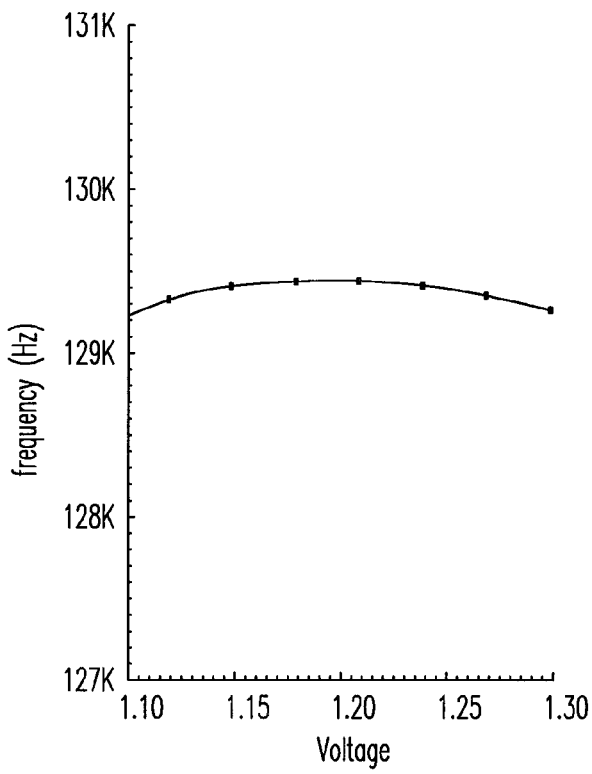
FIG. 4 shows a diagram of the operation voltage versus the frequency of the output signal of the oscillator according to an embodiment of the invention.
Figure 5:
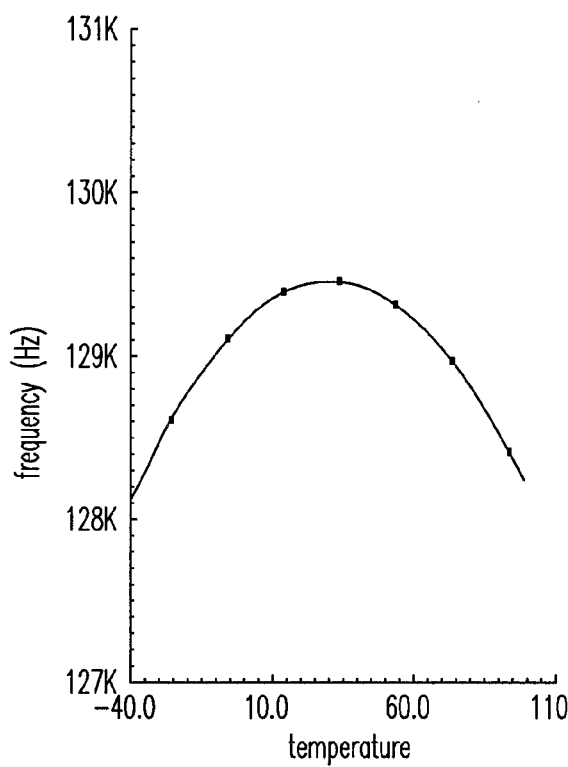
FIG. 5 shows a diagram of temperature versus the frequency of the output signal of the oscillator according to an embodiment of the invention.

FIG. 4 shows a diagram of the operation voltage versus the frequency of the output signal of the oscillator 100 according to an embodiment of the invention. FIG. 5 shows a diagram of temperature versus the frequency of the output signal of the oscillator 100 according to an embodiment of the invention. As shown in FIG. 4, when the operation voltage Vdd drifts between 1.1 volts and 1.3 volts, the frequency of the output signal of the oscillator 100 remains around 129 kHz. On the other hand, as shown in FIG. 5, when temperature varies between −40 degrees and 110 degrees, the frequency of the output signal of the oscillator 100 deviates from 128 kHz to at most 129.5 kHz and the deviation range of the frequency of the output signal is less than 2 kHz. As shown in FIG. 4 and FIG. 5, the oscillator 100 of the embodiment of the invention decreases the dependency of the frequency of the output signal versus temperature and the operation voltage.

In summary, an oscillator is provided in the invention and the oscillator includes a resistance unit and a capacitance unit. The capacitors of the capacitance unit are respectively coupled to the reference point or the reference ground according to the control signal. Thus, the equivalent capacitance of the capacitance unit is determined, and the frequency of the output signal of the oscillator is adjusted. Moreover, through the positive temperature coefficient resistor and the negative temperature coefficient resistor of the resistance unit, the deviation of the frequency of the output signal of the oscillator is not large when temperature changes. Furthermore, the invention also adjusts the ratios of the widths to the lengths of n-type transistors and p-type transistors of the inverters. Then, the deviation grade of the frequency of the output signal of the oscillator is decreased when the operation voltage drifts.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An oscillator, comprising:
    a resistance unit, serially connected between a first reference point and a second reference point;
    a capacitance unit, coupled between the first reference point and an output point and the capacitance unit comprising a plurality of capacitors, one terminal of each of the capacitors coupled to the output point, and the other terminal of each of the capacitors coupled to the first reference point or a reference ground according to a control signal, wherein the capacitance unit further comprises a plurality of switches, each of the switches having a first terminal, a second terminal, a third terminal, and a control terminal, wherein the control terminal of each of the switches receives the control signal, and the first terminal of each of the switches is coupled to each of the corresponding capacitors, and the second terminal of each of the switches is coupled to the first reference point, and the third terminal of each of the switches is coupled to the reference ground;
    a first inverter, having an input terminal coupled to the first reference point, and having an output terminal coupled to the second reference point; and
    a second inverter, having an input terminal coupled to the output terminal of the first inverter, and the second inverter having an output terminal coupled to the output point.

2. The oscillator as claimed in claim 1, further comprising a third inverter having an input terminal coupled to the output terminal of the second inverter, and the third inverter outputting a buffered driving signal.

3. The oscillator as claimed in claim 1, wherein the resistance unit comprises a positive temperature coefficient resistor and a negative temperature coefficient resistor, and the positive temperature coefficient resistor and the negative temperature coefficient resistor are serially connected between the first reference point and the second reference point.

4. The oscillator as claimed in claim 3, wherein the positive temperature coefficient resistor is formed with poly silicon.

5. The oscillator as claimed in claim 3, wherein the negative temperature coefficient resistor is formed with N-well area.

6. The oscillator as claimed in claim 1, wherein each of the capacitors is serially connected between each of the corresponding switches and the second reference point.

7. The oscillator as claimed in claim 1, further comprising:
    a controller, coupled to the capacitance unit for providing each of the control signals to each of the corresponding control terminals of the switches.

* * * * *